(12) United States Patent
Washburn et al.

(10) Patent No.: US 6,897,704 B2
(45) Date of Patent: May 24, 2005

(54) ELECTRONIC ISOLATOR

(75) Inventors: Robert D. Washburn, Malibu, CA (US); Robert F. McClanhan, Valencia, CA (US)

(73) Assignee: Thunder Creative Technologies, Inc., Malibu, CA (US)

( * ) Notice: Subject to any disclaimer, the term of this patent is extended or adjusted under 35 U.S.C. 154(b) by 0 days.

(21) Appl. No.: 09/866,563

(22) Filed: May 25, 2001

(65) Prior Publication Data

US 2002/0175736 A1 Nov. 28, 2002

(51) Int. Cl.⁷ .................................. H03L 5/00
(52) U.S. Cl. ................. 327/333; 327/319; 333/24.2
(58) Field of Search ................... 327/308, 309, 327/318, 319, 333, 379, 384; 333/24.2, 81; 326/26

(56) References Cited

U.S. PATENT DOCUMENTS

| | | | | |
|---|---|---|---|---|
| 4,888,675 A | * | 12/1989 | Kumar et al. ............... 363/47 |
| 4,903,006 A | * | 2/1990 | Boomgaard ............ 340/310 A |
| 4,908,531 A | * | 3/1990 | Podell et al. ............... 327/431 |
| 4,939,485 A | * | 7/1990 | Eisenberg ............... 333/104 |
| 4,975,604 A | * | 12/1990 | Barta ................... 327/308 |
| 5,072,142 A | * | 12/1991 | Tanino .................. 327/427 |
| 5,087,898 A | * | 2/1992 | Pyndiah et al. .......... 333/24 R |
| 5,146,506 A | * | 9/1992 | Sasaki .................. 381/94 |
| 5,272,457 A | * | 12/1993 | Heckaman et al. ......... 333/262 |
| 5,440,280 A | * | 8/1995 | Lord .................. 333/81 R |
| 5,448,207 A | * | 9/1995 | Kohama ................. 333/81 R |
| 5,497,118 A | * | 3/1996 | Ueno et al. .............. 327/416 |
| 5,523,712 A | * | 6/1996 | Miyabe et al. ............ 327/355 |
| 5,565,823 A | * | 10/1996 | Fratti .................. 333/81 R |
| 5,796,286 A | * | 8/1998 | Otaka .................. 327/308 |
| 5,903,178 A | * | 5/1999 | Miyatsuji et al. .......... 327/308 |
| 5,945,867 A | * | 8/1999 | Uda et al. .............. 327/431 |
| 6,028,405 A | * | 2/2000 | Kume et al. ............. 318/254 |
| 6,191,665 B1 | * | 2/2001 | Chan et al. ............. 333/175 |
| 6,255,905 B1 | * | 7/2001 | Gehrt ................. 330/107 |
| 6,300,814 B1 | * | 10/2001 | Takahashi ............... 327/308 |
| 6,424,210 B1 | * | 7/2002 | Iigai et al. ............. 327/563 |

* cited by examiner

Primary Examiner—Timothy P. Callahan
Assistant Examiner—Hai L. Nguyen
(74) Attorney, Agent, or Firm—Raysman Millstein Felder & Steiner LLP

(57) ABSTRACT

The present invention is an electronic isolator that provides low input to output insertion loss, high output to input insertion loss, and substantial asymmetric isolation between a source circuit and a load circuit. The invention actively reduces noise and reflected power appearing on the isolator output. In numerous embodiments, the invention operates in circuit applications from dc through millimeter wave. Multistage electronic isolator embodiments provide increased isolation and greater noise reduction. In other embodiments, the electronic isolator also removes noise appearing on its input. In another embodiment, the invention is configured for high power applications. This embodiment includes circuitry for redirecting power away from the load into resistors or other dissipative elements. In another embodiment, the electronic isolator is configured to remove signal distortion produced by one or more power amplifiers in the system.

10 Claims, 15 Drawing Sheets

ELECTRONIC ISOLATOR

BACKGROUND OF THE INVENTION

1. Field of the Invention

The present invention relates to the field of electronic isolators.

2. Background Art

Electronic circuits are often made up of a number of discrete "stages" where the output of a first stage is provided as input to a subsequent second stage. To maximize performance, it is sometimes desired to provide isolation between the stages, so that the operation of the first stage is not affected by the operation of the second stage. Generally, this has been accomplished by employing an isolator between the circuit stages. However, currently available isolators suffer from a number of disadvantages.

Referring to FIG. 1, a multistage circuit is symbolically indicated. The circuit consists of a source stage 100 that provides output to a load stage 120. The source and load stages are separated (and isolated) by an isolator 110. The isolator 110 minimizes unwanted interactions between the source and load stage and protects circuitry of the source stage from damage due to power reflections from the load stage. Currently isolators are implemented by one of several methods, including magnetic isolators and circulators, rat race circuitry, and resistive pads. These solutions all have significant limitations in performance and applicability.

Magnetic Isolators

The magnetic isolator is a common implementation of the isolator function. Magnetic isolator devices use Faraday rotation to differentiate between waves traveling in different directions. A magnetic isolator generally consists of a magnetic material (typically a ferrite) sandwiched between two poles of a permanent magnet. The effective operation of such a device requires that a significant portion of a wavelength be physically present in the device. This requirement in turn effectively determines the physical size of the magnetic isolator. (The size is also dependent on both the permitivity and permeability of the ferrite material as well as the strength of the permanent magnet that is used to bias the ferrite material.)

The magnetic bias is used to create a non-reciprocal environment within the ferrite that induces a polarization change in a propagating wave. This polarization change is used to direct the wave along a particular path, either to the output or to a dummy load. Since these devices make use of the wave characteristics of the signal, changing the frequency changes the dependent phase characteristics, and the resulting isolation parameters of the isolator. The result is a relatively narrow band device (10%–20% being typical) that is relatively large and costly. As a result, the use of magnetic isolators is typically restricted to certain applications where the size can be accommodated, such as test equipment and the interface between high power amplifiers and antennas being the principle applications.

Rat Race Circuit

The rat race circuit is a closed loop or circuit path. It relies on the constructive and destructive interference of signals to produce low insertion loss and high isolation effects. If a transient signal is introduced at a point along the closed path, it propagates in both directions. At some point(s) the two signals constructively interfere and an output port of the proper characteristic impedance can be located there. The signals destructively interfere at the input port as they continue to propagate around the circuit or are reflected off the output port. Similarly, it is possible to locate a point(s) where a signal injected at the output port constructively interferes while at the same time the same signal injected at the input destructively interferes. This point is the location of the third port in a circulator configuration.

A disadvantage of the rat race approach is that as an interference system, it is inherently narrow band. The second problem is that the path length of the closed loop must be a significant portion of a wavelength. Preferably, it will be several wavelengths long. Thus, even at microwave frequencies, the path may be too long to be practical. It is certainly much too long to be incorporated into an integrated circuit much below W-band.

Pads

Another approach has been the use of a "pads" which are resistor networks having specified input and output characteristic resistances and a specified attenuation of the input signal. Pads operate by attenuating the signals for both forward and reverse directions. This isolation reduces the amount of feedback to the source stage but requires the source stage to provide a higher gain and output power to compensate for the loss in the desired input to the load stage. For example, if it is desired to have 10 dB of isolation between stages of an amplifier, then the pad would need to be a 10 dB attenuator and the previous stage would need to have 10 times the gain and 10 times the output power. This additional power requirement may be too expensive to achieve or may unduly limit circuit performance.

Pads can be made asymmetric by having different input and output resistances. However, these are typically used where a true impedance transformation is desired. In most applications, the impedance levels are the same and standardized to enable easy interface with commercial test equipment. As a result, the use of isolation pads is usually limited to low power circuits and compensation for the loss is achieved by added gain stages, or added gain and power from the down stream circuitry, an expensive and complicated solution.

SUMMARY OF THE INVENTION

The present invention is an active electronic circuit that is placed between the output of one electronic circuit (the source stage) and the input of a second electronic circuit (the load stage) and provides highly asymmetric attenuation of the electrical signals passing between the two circuits. The asymmetric attenuation typically provides for relatively low attenuation of the signal passing from the source to the load (usually a desired signal) and relatively high attenuation of the signal(s) passing from the load to the source (usually undesired signals).

The present invention has the ability to simultaneously achieve high asymmetry between a low insertion loss and the high isolation attenuation, and to do so over a very much wider band of operation than prior art configurations can achieve. The present invention is typically smaller, lighter and less expensive than prior art implementations, and thus can be incorporated into integrated circuits for low power applications.

In one or more embodiments, the present invention includes an electronic circuit having general characteristics that approximate an ideal voltage controlled voltage source. This type of electronic circuit is non-ideal and subsequently referred to as either a controlled voltage source or a voltage controlled voltage source.

In one embodiment, the present invention comprises a controlled voltage source used in connection with a tee type resistor configuration to provide isolation between source and load stages. The output of the controlled voltage source is set such that the tee leg of the circuit has a dynamic resistance that appears to be substantially infinite as to its impact on the source. In other embodiments, an active feedback voltage source is used which may or may not be gain adjusted, depending on the application. In one of more embodiments of the present invention, the electronic isolator is implemented in a multistage configuration, with or without gain adjusted active feedback. In one or more embodiments, the electronic isolator of the present invention is used in frequency band signal transmission applications. The invention may be used, for example, as part of a high power isolator.

DETAILED DESCRIPTION OF THE INVENTION

The present invention is directed to an electronic isolator. In the following description, numerous specific details are set forth to provide a more thorough description of embodiments of the invention. It is apparent, however, to one skilled in the art, that the invention may be practiced without these specific details. In other instances, well known features have not been described in detail so as not to obscure the invention.

The present invention enables electronic circuit designers to realize the classic isolation function with an electronic circuit design as opposed to a non-linear physical process. This invention differentiates the source signal from the source signal plus noise reflected from the load. This noise may include out-of-phase source signal or harmonic distortion induced by a nonlinear device such as a diode or transistor. This invention uses no magnets or magnetic materials. It is not wavelength sensitive and as such is wideband with no significant frequency sensitivity.

Since it does not use large magnetic components, one or more of these devices can be integrated into a single integrated circuit. This integration capability results in a true, low insertion loss isolator.

In the various embodiments of this invention, the circuits are typically shown as purely resistive networks. This is done to provide the clearest description of the operation of the electronic isolator. This does not imply that reactive elements and networks cannot be included. Both series and parallel tuned circuits can be included in any leg of the isolator to shape performance and response. The circuit designer need only understand the nature of the response shaping being undertaken and the effects of the reactive networks on system performance parameters such as frequency response, phase shift, and attenuation.

In many of the Embodiments shown, the active devices are shown as bipolar junction transistors. Any of the embodiments can also be implemented with Field Effect Transistors (FETs), vacuum tubes, tunnel diodes, optical isolators, magnetic regulators or other gain capable devices.

Figure 1:
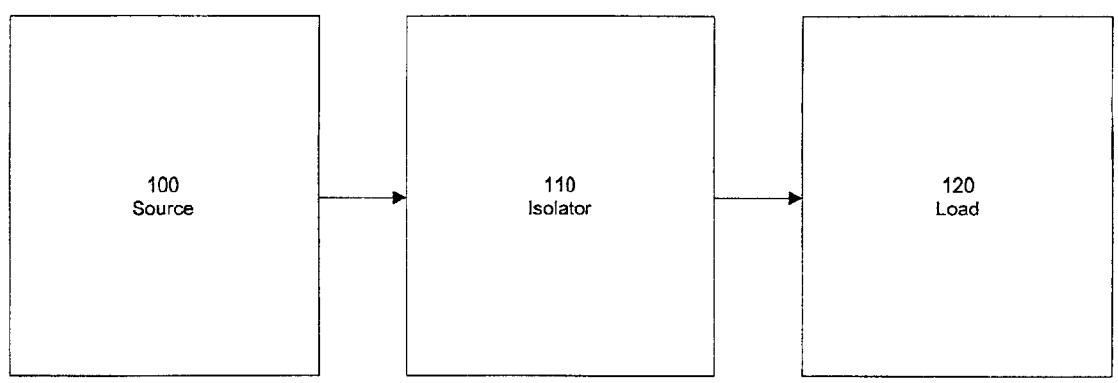
FIG. 1 is a block diagram of a multistage circuit with an isolator between stages.
Figure 2:
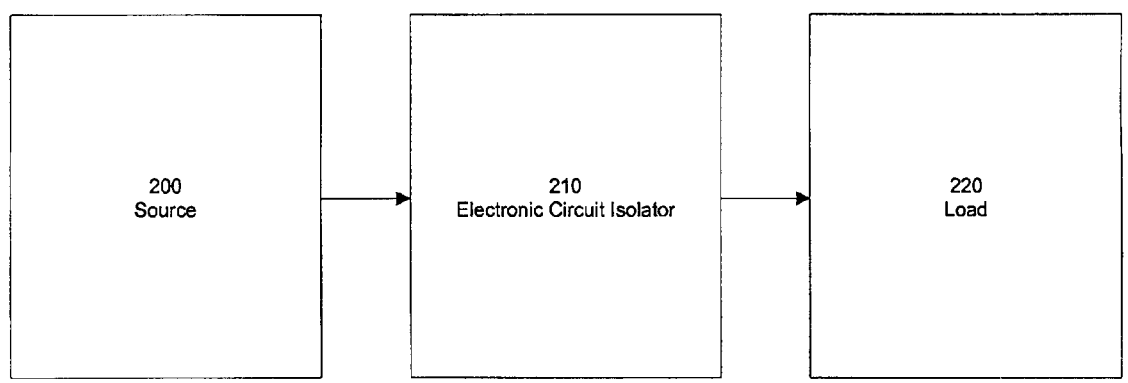
FIG. 2 is a block diagram of a multistage circuit with an electronic circuit isolator of the present invention between stages.

FIG. 2 illustrates a block diagram of the invention. The invention, being an electronic circuit design instead of a physical process, is referred to as an electronic circuit isolator or electronic isolator in this description. The electronic isolator 210 is shown between a source stage 200 and load stage 220.

Source Block

Figure 3:
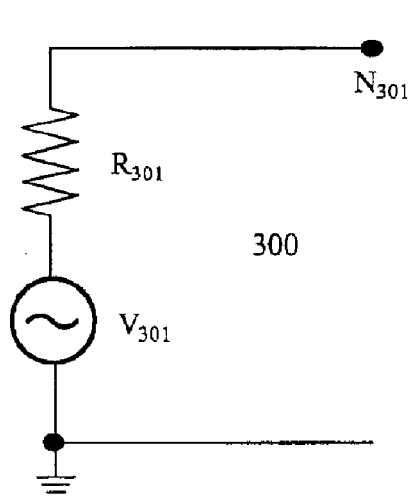
FIG. 3 is a circuit diagram of a source stage used as an example in the present invention.

FIG. 3 illustrates an example 300 of source stage that may be used with the present invention. Source stage 300 comprises voltage source V301 coupled to ground at its negative terminal and to resistor R301 at its positive terminal. Resistor R301 is coupled to node N301 opposite voltage source V301. V301 represents the signal source (e.g., from an amplifier stage). R301 represents the source resistance. In practice, R301 may comprise any number of circuit resistance topographies. This source structure is typical for the other embodiments.

Load Block

Figure 4:
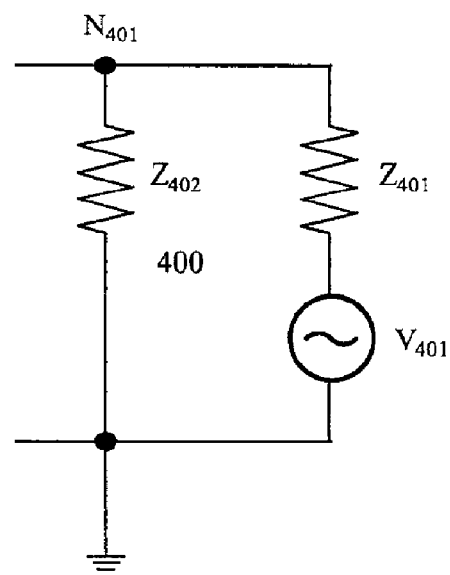
FIG. 4 is a circuit diagram of a load stage used as an example in the present invention.

FIG. 4 illustrates an example 400 of a load stage in the present invention. Load stage 400 comprises voltage source V401 coupled to ground at its negative terminal and to impedance Z401 at its positive terminal. Load impedance Z402 is coupled to impedance Z401 at Node N401. At its opposite terminal, Z402 is coupled to ground. Voltage source V401 represents the source of noise being injected into the system through its source impedance Z401. The noise can consist of a variety of component parts. These include an out of phase portion of the input signal power that reflected off the load, feedback of electronic noise generated or picked up by down stream circuitry, radiated and coupled noise from nearby circuitry or lines injected into this circuit or its output cable. It also can include distortion, as well as thermal, shot, or other internally generated noise. There will typically be more than one noise source each with its own characteristic source impedance and equivalent injection point. Only one is shown to simplify the figure. This noise structure is typical for the other embodiments.

Electronic Isolator Circuit

Figure 5:
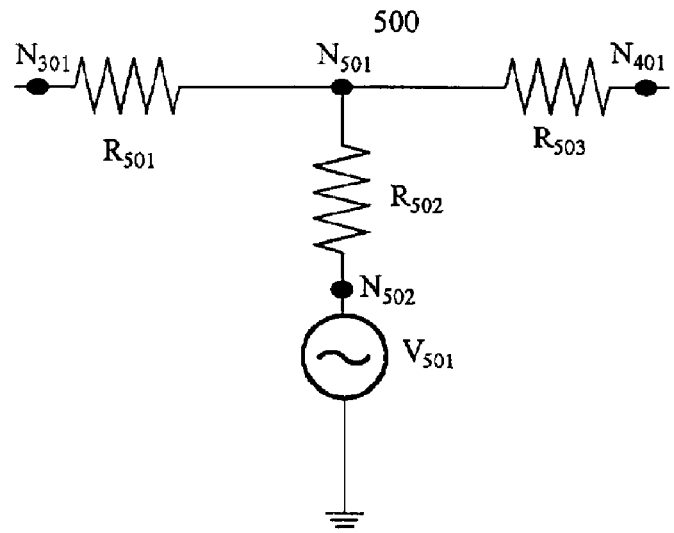
FIG. 5 is a circuit diagram of one embodiment of the electronic isolator of the present invention.

FIG. 5 illustrates an embodiment of the present invention. T-Network 500 is coupled to source block at node N301. T-Network 500 is coupled to load block at node N401. Isolator input resistor R501 is coupled to source block at node N301 and to isolator output resistor R503 at node N501. Resistor R503 is coupled to load block at node N401. Tee resistor R502 is coupled to resistor R501 and resistor R503 at node N501. Voltage source V501 is coupled to resistor R502 at its positive terminal and to ground at its negative terminal.

Tee-resistor R502, in conjunction with the gain and source resistance of voltage source V501, determine the range and amount of current injected or sunk to cancel the noise present. Voltage source V501 should be selected to be as close to an ideal voltage source as is practical and appropriate for a specific application. This helps to localize the power dissipation in the resistors rather than the controlled source.

In this configuration, with noise voltage V401 equal to zero, the circuit is configured so that there is no current flowing through R502. This is accomplished by selecting V501 with a gain equal to that produced by voltage source V301 at node N501. Since there is no current flowing in the tee leg, the resistance of the tee leg appears infinite. For example, if V301 is 1 Volt (V), source resistance R301 and load impedance Z402 are nominally 50 Ohms, R501 and R502 are 1 ohm, and R503 is 9 ohms, the current through R501 will be 9.091 milliamperes and voltage source V501 should be selected to be 0.983333 V. Insertion loss for the electronic isolator in this example is approximately 0.79 dB.

Assuming the addition of noise source V401 to the circuit with a source voltage of 10V and Z401 equal to 50 ohms, the nominal noise voltage appearing at Node N301 is 0.137 V and the achieved isolation is approximately 12.9 dB.

Electronic Isolator Circuit with Voltage Controlled Voltage Source

Figure 6:
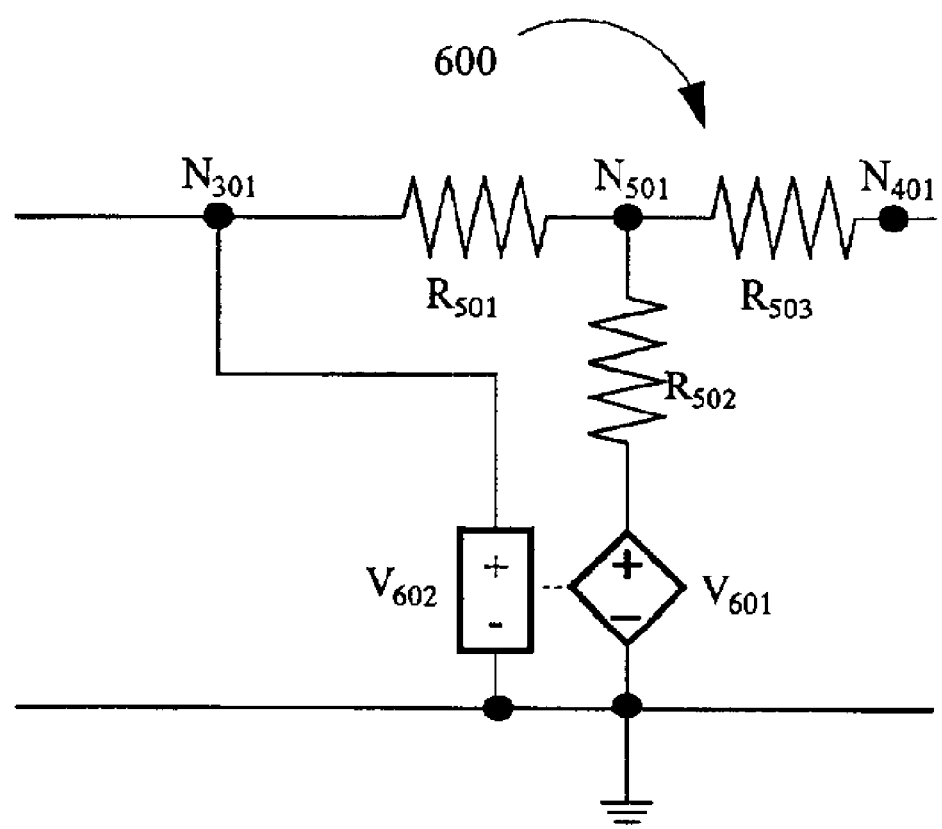
FIG. 6 is another embodiment of the electronic isolator of the present invention.

FIG. 6 illustrates an embodiment of the present invention in which isolator voltage V601 is a controlled voltage source. T-Network 600 is coupled to source block at node N301. T-Network 600 is coupled to load block at node N401. Isolator input resistor R501 is coupled to source block at node N301 and to isolator output resistor R503 at node N501. Resistor R503 is coupled to load block at node N401. Tee-Resistor R502 is coupled to resistor R501 and resistor R503 at node N501. Voltage source V601 is coupled to resistor R502 at its positive terminal and to ground at its negative terminal. Voltage controller V602 is coupled to source block at node N301 at its positive terminal and coupled to ground at its negative terminal.

T-Network 600 essentially functions like T-Network 500, although the replacement of voltage source V501 with controlled voltage source V601 means that the isolator voltage source does not need to be replaced in divergent circuit conditions.

Electronic Isolator Circuit with Active Feedback

Figure 7:
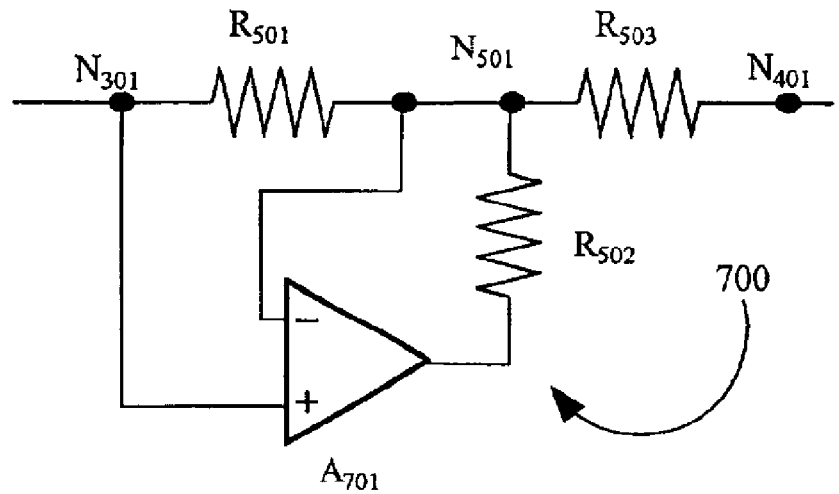
FIG. 7 is an embodiment of the electronic isolator of the present invention with active feedback.

FIG. 7 illustrates an alternate embodiment of the present invention in which the T-Topography of FIGS. 5 and 6 is replaced by an operational amplifier in a negative feedback configuration. Electronic Isolator 700 is coupled to source block at node N301. Isolator 700 is coupled to load block at node N401. Resistor R501 is coupled to the source block at node N301 and to resistor R503 at node N501. Resistor R503 is coupled to load block at node N401. Operational amplifier A701 is connected at its positive terminal to the source block at node N301. The negative terminal of A701 is coupled to node N501. The output of A701 is coupled to node N501. Resistor R502 is coupled to resistors R501 and R503 at node N501.

As in the T-Topography circuit configuration, V301 represents the signal source (such as a previous amplifier stage) with a source resistance R301. Noise source V401 represents the source of noise being injected into the system through its source impedance Z401. Impedance Z402 represents the input impedance of the next circuit. Resistors R501, R502 and R503 are the tee resistors and A701 is an operational amplifier performing the role of a high gain voltage source.

There may be a tendency in this circuit for amplifier A701 to force the current in R501 to zero and supply the load current itself. If R502 does not match the load impedance Z402, power transmission will be reduced and dissipation in the operational amplifier increased. This problem is alleviated in another embodiment by providing a gain adjustment for the circuit that produces an accommodation for the voltage drop across R501.

Electronic Isolator Circuit with Gain Adjusted Active Feedback

Figure 8A:
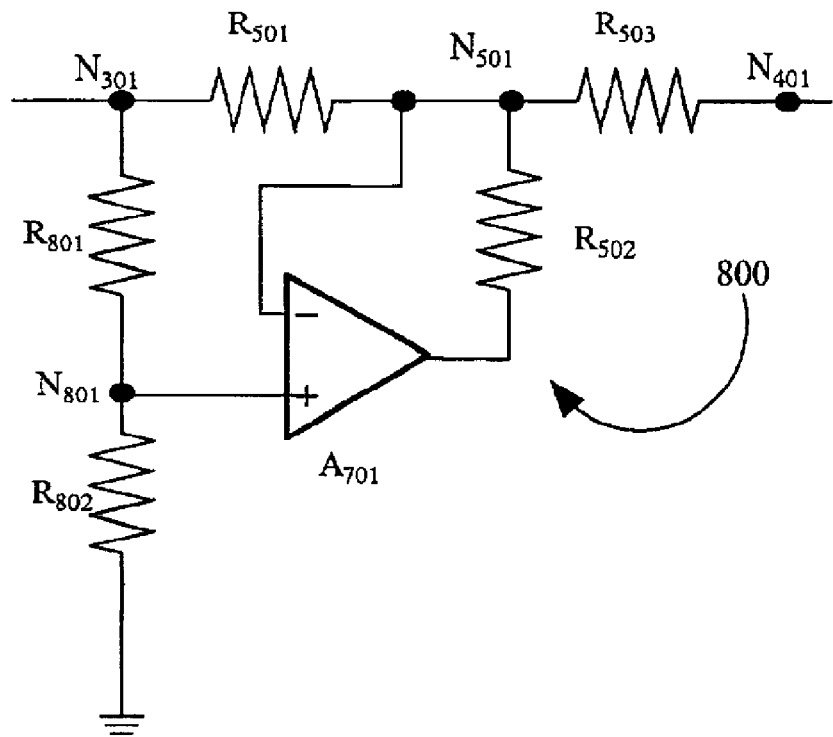
FIG. 8A is an embodiment of the electronic isolator of the present invention with gain adjusted active feedback in which the tee leg amplifier is within the feedback loop.

FIG. 8A illustrates an embodiment of the present invention in which the circuit of FIG. 7 is implemented with a gain adjustment network. Electronic isolator 800 is coupled to source block at node N301. Isolator 800 is coupled to load block at node N401. Resistor R501 is coupled to the source block at node N301 and to resistor R503 at node N501. Resistor R503 is coupled to load block at node N401. Resistor R801 is coupled to node N301. Resistor R802 is coupled in series to resistor R801 at node N801 and to ground. Operational amplifier A701 is connected at its positive terminal to node N801. The negative terminal of A701 is coupled to node N501. The output of A701 is coupled to resistor R502. Resistor R502 is coupled to Resistors R501 and R503 at node N501.

In one embodiment, the isolator circuit is implemented with a divider network (R801 and R802) that attenuates the input signal from voltage source V301 to provide the reference signal for the operational amplifier. In this embodiment, the adjustment provided by the divider network is the nominal value of the voltage drop across resistor R501. Moreover, the operational amplifier does not attempt to force the Tee-Junction to match the input voltage, as may occur in the embodiment illustrated in FIG. 7. In another embodiment, the circuit actively calculates and tracks the R501 loss in or near real time if load impedance Z402 varies significantly.

Repeating the example shown with FIG. 6 (V301=1 V, R501=1 Ohm and R503=9 Ohm), assuming that the operational amplifier output current has been made zero by the feedback mechanism, and selecting R801=1000 Ohm, R802 should be 59,000 Ohm. Neglecting the current through the divider network, the current through R501 is again 9.091 milliamperes.

With respect to the injection of a similar noise source (V401=10 V and Z401=50 Ohms) into the circuit, the following assumptions are made for the purpose of example only. First, the noise source is the largest with which the electronic isolator must cope. Second, the maximum voltage swing for Amplifier A701 is +/−12 Volts.

At an instantaneous noise voltage of 10 Volts, the output of Amplifier A701 is at its negative maximum of −12 volts.

Solving the equations for the injected noise to be 0 at Node 501 implies the value of R502 should be approximately 82 Ohms. In this example, the noise appearing on the input is 0 and the isolation is infinite. The achievable performance is significantly improved compared to the open loop versions of the electronic isolator.

Due to the gain of the amplifier A701, the value of R503 is much larger than the 1 ohm Tee Resistor in the FIG. 5 example. The resistance of R503 can vary as long as amplifier A701 is not allowed to rail or exceed its current source/sink capability during normal operation. In practice, there are several reasons for considering this calculated value of R503 to be an upper limit and selecting a value that is smaller. First, any noise sources present are not likely to be well characterized with known maximum amplitudes. Second, the presence of reactive parasitic elements in the system or possible antenna induced, high VSWR conditions can result in larger than normal peak amplitude voltages being encountered. In both cases, it is desirable to provide the operational amplifier with as much headroom as practical to attempt to correct the condition. Third, a larger than necessary output swing on amplifier A701 can induce additional time delay and the associated potential distortion (see time delay discussion in the multistage versions below), or can require the use of a more costly, higher slew rate operational amplifier. Fourth, larger resistors generate more thermal noise that could degrade the performance of very low nose systems.

Figure 8B:
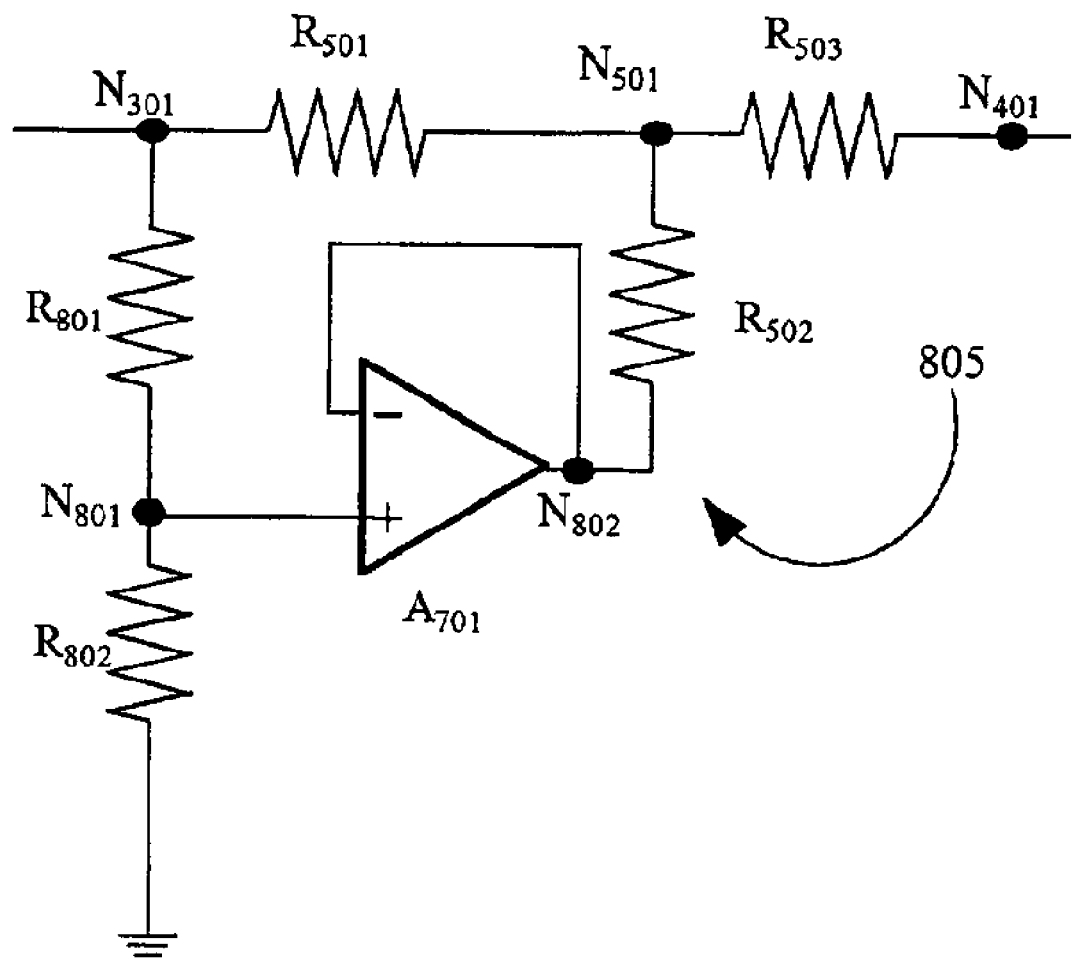
FIG. 8B is an embodiment of the electronic isolator of the present invention with gain adjusted active feedback in which the tee leg amplifier is configured as a voltage source.

An alternate embodiment of the gain adjustment network is shown in FIG. 8B. In this embodiment, the negative feedback is taken directly from the operational feedback output with a significantly reduced value for Tee Resistor R502. Electronic isolator 805 is coupled to source block at node N301. Isolator 805 is coupled to load block at node N401. As in the previous embodiment, resistor R501 is coupled to the source block at node N301 and to resistor R503 at node N501. Resistor R503 is coupled to load block at node N401. Resistor R801 is coupled to node N301. Resistor R802 is coupled in series to resistor R801 at node N801 and to ground. Operational amplifier A701 is connected at its positive terminal to node N801. The output of A701 is coupled to resistor R502 at Node N802. The output of amplifier A701 is fed back to the negative terminal at Node N802. Resistor R502 is coupled to Resistors R501 and R503 at node N501.

In one embodiment, the isolator circuit is implemented with a divider network (R801 and R802) that attenuates the input signal from voltage source V301 to provide the reference signal for the operational amplifier. In this embodiment, the operational amplifier functions as a classic voltage source. In still another embodiment, Tee Resistor R502 is replaced by two resistors and feedback to Amplifier A701 is taken directly from the midpoint.

Multistage Electronic Isolator Circuit with Current Sense

Figure 9:
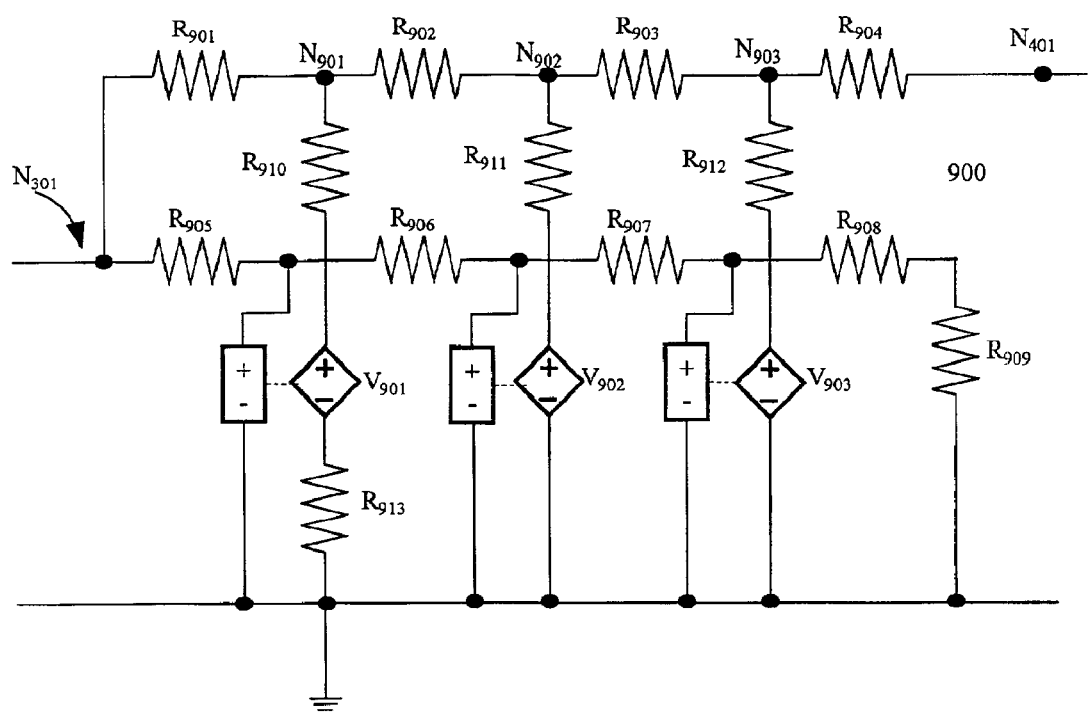
FIG. 9 is a circuit diagram of a multistage electronic isolator with current sense.

FIG. 9 illustrates an alternate embodiment of the present invention, which is a multistage circuit with current sense. Electronic isolator 900 is coupled to source block at node N301. Isolator 900 is coupled to load block at node N401. Input resistor R901 is coupled to source block at node N301. Output resistor R904 is coupled to load block at node N401. Resistors R902 and R903 simultaneously function as both input and output resistors for Tee stages in the isolator circuit. Resistor R902 is coupled in series to input resistor R901 at node N901. Resistor R903 is coupled in series to output resistor R904 at node N903 and in series to resistor R902 at node N902.

Resistors R910, R911 and R912 are the Tee Resistors for controlled voltages sources V901, V902, and V903, respectively. Accordingly, resistor R910 is coupled to resistors R901 and R902 at node N901. Controlled voltage source V901 couples resistor R910 at its positive terminal to current sense resistor R913 at its negative terminal. Resistor R913 couples V901 to ground. Resistor R911 is coupled to resistors R902 and R903 at node N902. Controlled voltage source V902 couples resistor R911 at its positive terminal to ground at its negative terminal. Resistor R912 is coupled to resistors R903 and R904 at node N903. Controlled voltage source V903 couples resistor R912 at its positive terminal to ground at its negative terminal. In one embodiment, resistors R905, R906, R907 and R908 form a low power, divider network which sets the input voltages of controlled voltage sources V901, V902 and V903 to the values at the respective Tee Nodes. Accordingly, the resistances of these components are typically proportional to the corresponding series resistor in the primary power path. Thus, resistor R905 couples source block at node N301 to the controller for V901. The resistance of R905 is proportional to the resistance of R901. Resistor R906 is next in series and couples the controller for V901 to the controller for V902. The resistance of R906 is proportional to the resistance of R902. Resistor R907 is next in series and couples the controller for V902 to the controller for V903. The resistance of R907 is proportional to the resistance of R903. Resistors R908 and R909 complete the divider network and couple the network to ground.

As in previous figures, V301 represents the signal source (such as a previous amplifier stage) with its source resistance R301. V401 represents the source of noise being injected into the system through its source impedance Z401. Z402 represents the input impedance of the next circuit, and is typically complex. Since Z402 is typically unknown, it will sometimes be necessary to adjust the value of R909 to achieve an optimal balance between the two resistor strings. In one embodiment, the current in sense resistor R913 is measured and the value of R909 is adjusted to reduce the R913 signal current to zero.

Multistage Electronic Isolator Circuit with Gain Adjusted Active Feedback

Figure 10:
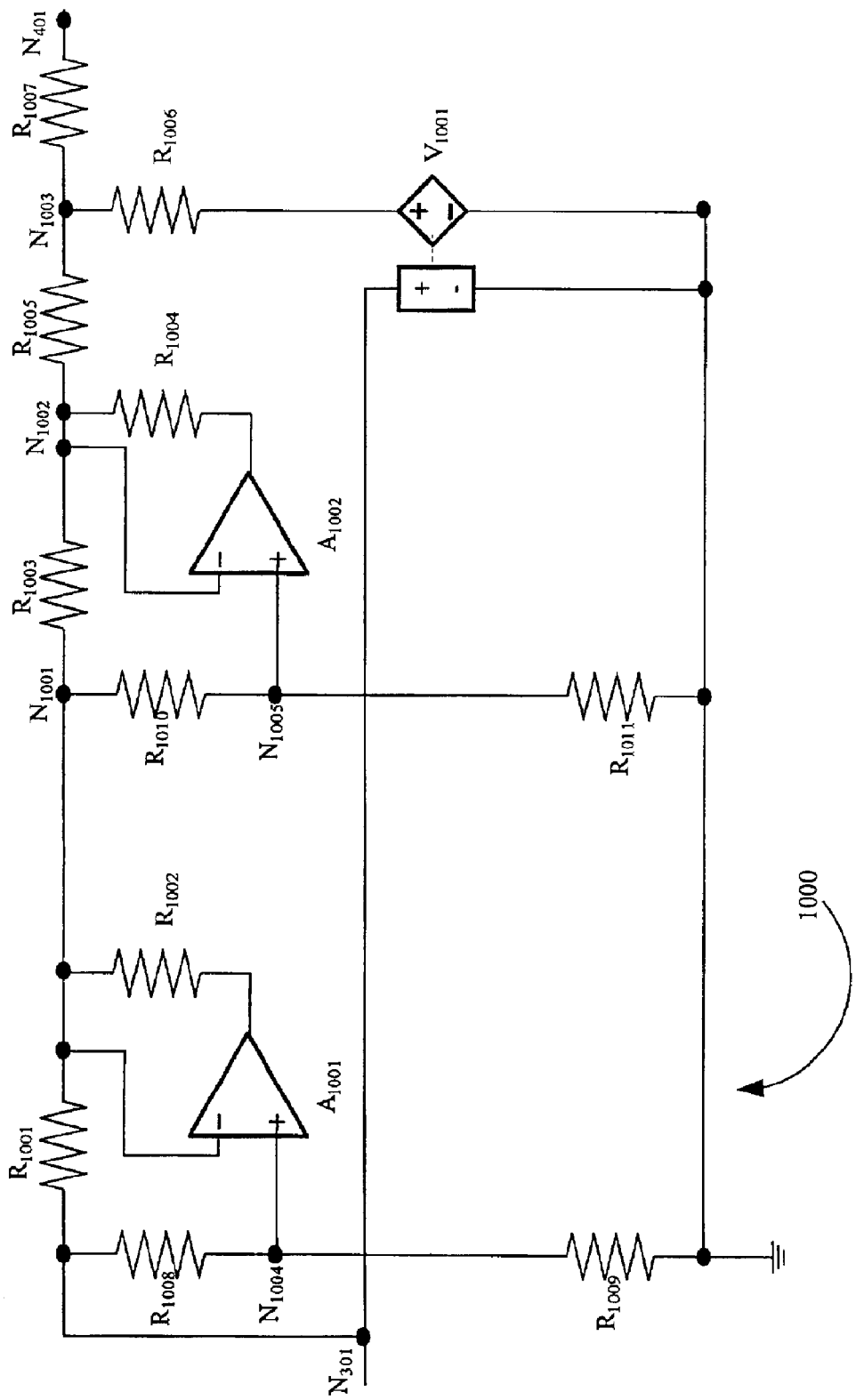
FIG. 10 is a circuit diagram of a multistage electronic isolator with gain adjusted active feedback.

FIG. 10 illustrates an embodiment of the present invention which is a three stage isolator circuit with the first two stages implemented with the operational amplifier embodiment shown in FIG. 8A. The third stage is shown implemented with an amplifier capable of dissipating the maximum forward power driving the isolator input. It is important that the high power dissipation is concentrated in R1006 and V1001 or the preceding stage(s) will also need to be power amplifiers. This embodiment with power dissipation concentrated in the output stage is used at low and medium power levels. In another embodiment, the last stage is an operational amplifier capable of dissipating the full incident power. An alternative embodiment incorporates an operational amplifier driving another amplifier circuit.

Accordingly, electronic isolator 1000 is coupled to source block at node N301. Isolator 1000 is coupled to load block at node N401. In the first stage, resistor R1001 is coupled to the source block at node N301 and to resistor R1003 at node N1001. Resistor R1008 is coupled to node N301. Resistor R1009 is coupled in series to resistor R1008 at node N1004 and to ground. Operational amplifier A1001 is connected at its positive terminal to node N1004. The negative terminal of A1001 is coupled to node N1001. The output of A1001 is coupled to resistor R1002. Resistor R1002 is coupled to resistors R1001, R1003 and R1010 at node N1001.

In the second stage, resistor R1003 is coupled to resistor R1001 at node N1001 and to resistor R1005 at node N1002.

Resistor R1010 is coupled to node N1001. Resistor R1011 is coupled in series to resistor R1010 at node N1005 and to ground. Operational amplifier A1002 is connected at its positive terminal to node N1005. The negative terminal of A1002 is coupled to node N1002. The output of A1002 is coupled to resistor R1004. Resistor R1004 is coupled to resistors R1003 and R1005 at node N1002.

The third stage is a T-Topology configuration. Accordingly, output resistor R1007 couples load block at node N401 to input resistor R1005. Tee Resistor R1006 couples controlled voltage source V1001 at its positive terminal to resistors R1005 and R1007 at node N1003. The negative terminal of controlled voltage source V1001 grounds the circuit. In one embodiment, the controller for V1001 is coupled to load block at node N301 and to ground.

The multistage configuration introduces time delays into the operation of the electronic isolator. At low frequencies (up to at least several tens to hundreds of megahertz), the combined time delay and slew rate capability of the available operational amplifiers means the isolation process does not introduce significant distortion on the incident waveform. In one or more embodiments in which the electronic isolator processes higher frequencies, it is necessary to match time delays in the circuitry. The embodiment shown in FIG. 10 passes a sample of the input signal directly to the third stage in a form of feed forward, which is used to minimize the distortion effects introduced by circuit time delay. In alternate embodiments, the feed forward is applied to one or more interim stages. In still other embodiments, the feed forward includes circuitry to provide an adjustable time delay for more precise matching of the incident power form.

Multistage High Power Electronic Isolator

One of the functions of an isolator is protection of the electronic circuitry driving its input port from variations in the load circuitry on its output port, particularly in high power applications. These conditions typically include both open and shorted outputs.

The protection function provided in the prior art by magnetic isolators is provided in one or more embodiments of the present invention. Internal dissipation of the reflected power requires the source in the last stage to handle nearly the full incident power for at least a short period of time. In general, this is the equivalent of adding a second high power amplifier to the system, and represents a significant size and cost effect on the system. This is mitigated by making the isolator output stage amplifier have pulse power capability equivalent to the maximum output power of the source. Dumping the power into a dummy load is an alternative that requires both fault sensing and power switching circuitry that requires time to operate. A high pulse power isolator output stage amplifier embodiment mitigates the cost of an isolator as compared to an embodiment that must handle the same power on a continuous basis.

One advantage of switching the power into a dummy load is that the protective function is contained within the electronic isolator and does not require interstage communication of control signals. If a protection system is configured wherein control signals are generated to turn-off, reduce, or redirect the electrical input power to the isolator, the control signals typically require a time delay capability to accommodate normal functions such as turn-on or short term, self correcting anomalies.

Figure 11:
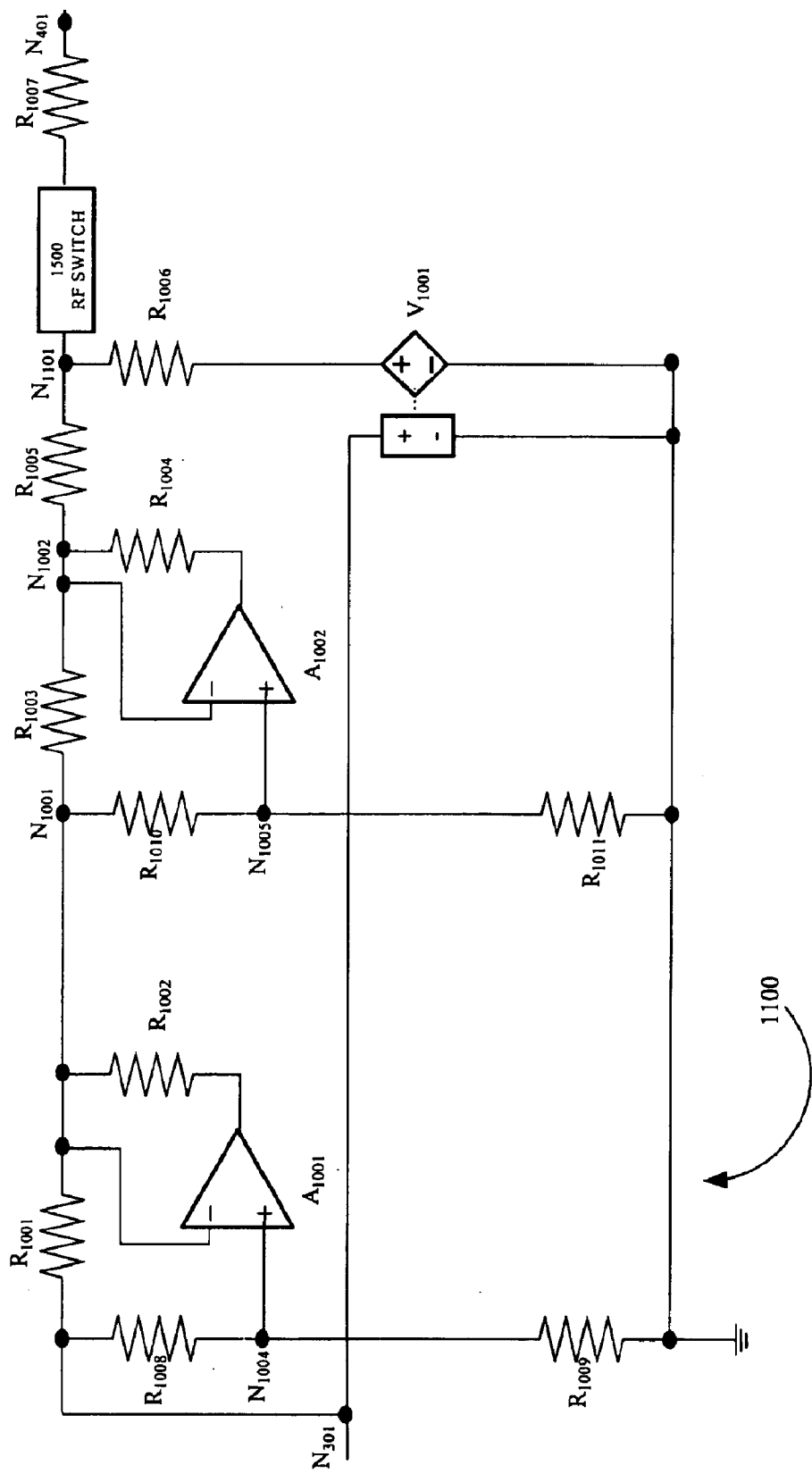
FIG. 11 is a circuit diagram of a multistage high power electronic isolator.
Figure 15:
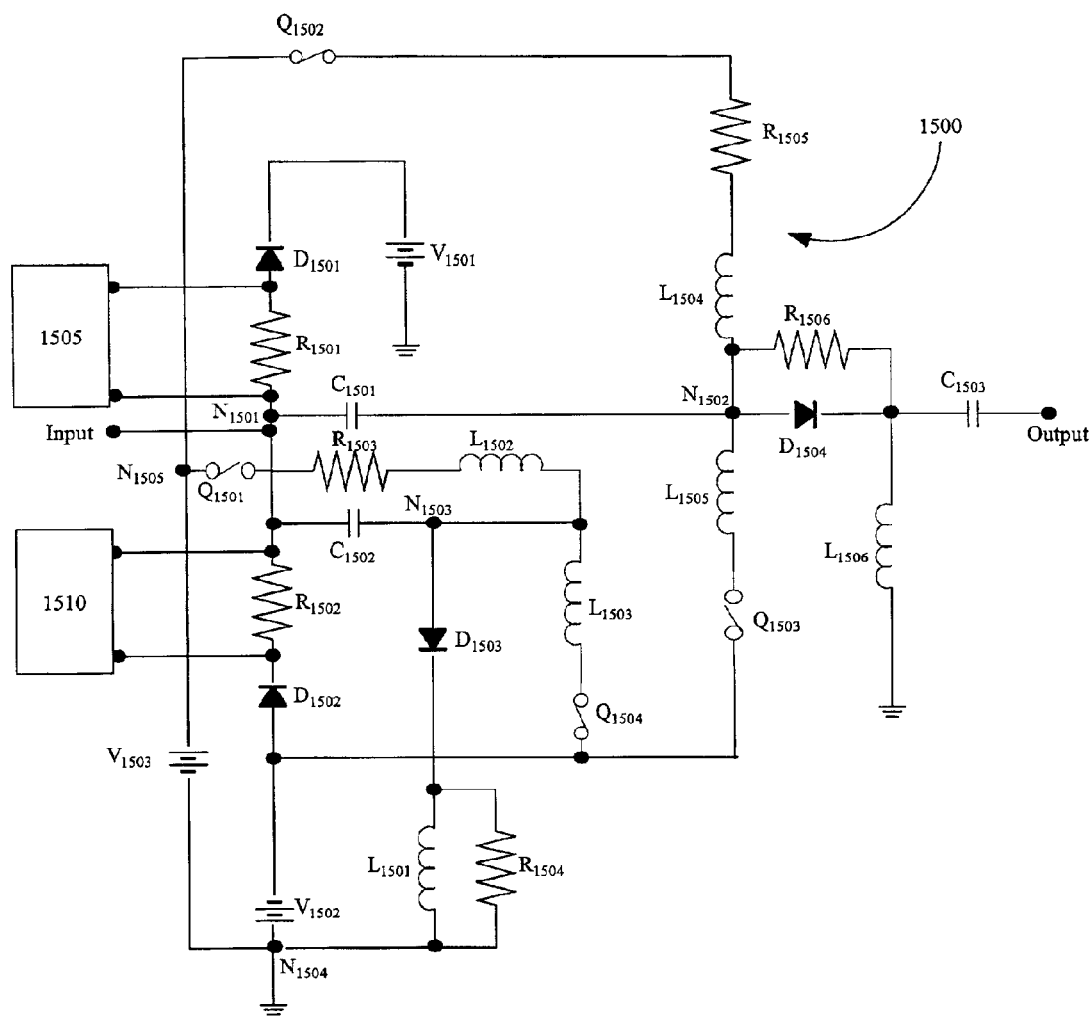
FIG. 15 is a circuit diagram of a radio frequency (RF) switch for a high power electronic isolator implementation.

FIG. 11 illustrates an embodiment of the electronic isolator in accordance with the present invention in which an RF switch is incorporated into the circuit of FIG. 10 to "open" the circuit path between the isolator source and load circuitry. A diode switch is the preferred method due to its relatively high speed. (An example of such a switch including potential features and characteristics is shown in FIG. 15.)

Accordingly, electronic isolator 1100 is coupled to source block at node N301. Isolator 1100 is coupled to load block at node N401. In the embodiment illustrated in FIG. 11, resistor R1001 is coupled to the source block at node N301 and to resistor R1003 at node N1001. Resistor R1008 is coupled to node N301. Resistor R1009 is coupled in series to resistor R1008 at node N1004 and to ground. Operational amplifier A1001 is connected at its positive terminal to node N1004. The negative terminal of A1001 is coupled to node N1001. The output of A1001 is coupled to resistor R1002. Resistor R1002 is coupled to resistors R1001, R1003 and R1010 at node N1001.

Resistor R1003 couples the second stage to the first stage at node N1001. Resistor R1003 is coupled to resistor R1005 and R1004 at node N1002. Resistor R1011 is coupled in series to resistor R1010 at node N1005 and to ground. Operational amplifier A1002 is connected at its positive terminal to node N1005. The negative terminal of A1002 is coupled to node N1002. The output of A1002 is coupled to resistor R1004.

The third stage is a T-Topology configuration. RF switch 1500 is incorporated between output resistor R1007 and the T-Branch. Accordingly, output resistor R1007 couples the load block at node N401 to RF switch 1500. Tee Resistor R1006 couples controlled voltage source V1001 at its positive terminal to resistor R1005 and RF switch 1500 at Node N1101. The negative terminal of controlled voltage source V1001 grounds the circuit. In one embodiment, the controller for V1001 is coupled to the source block at node N301 and to ground.

Electronic Isolator Implemented with Class A Amplifier

Figure 12:
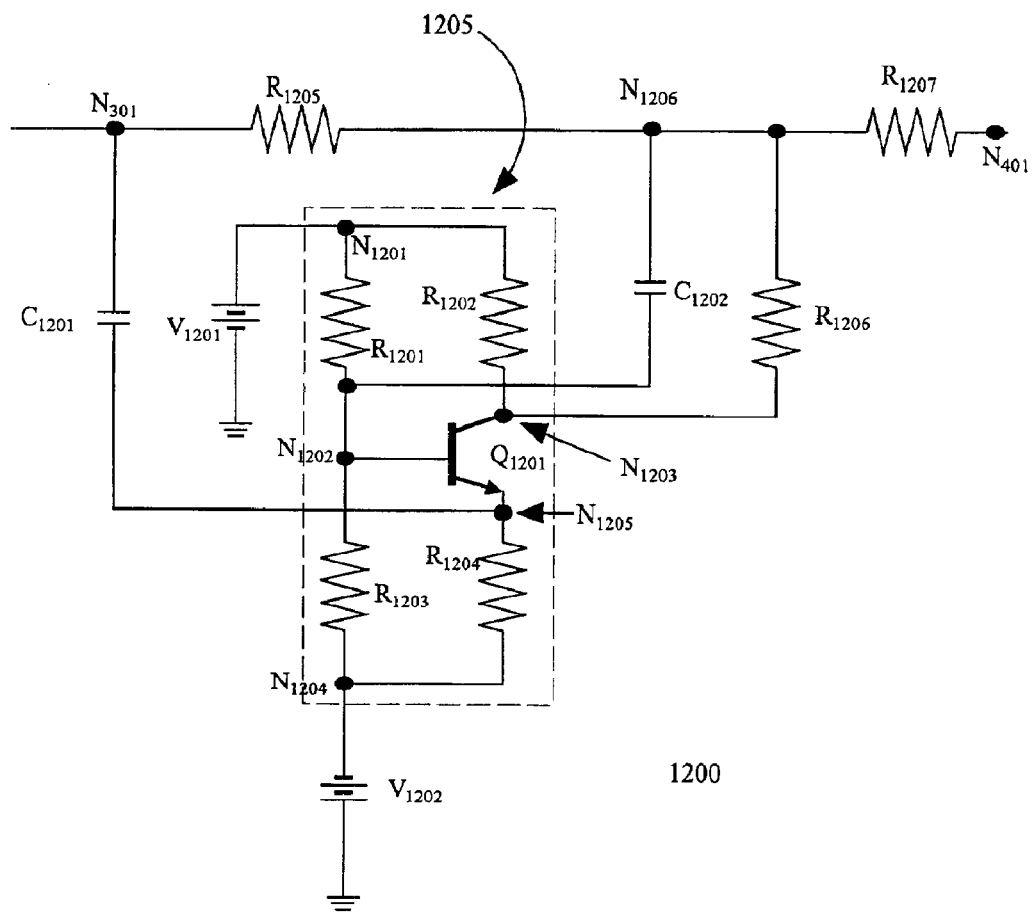
FIG. 12 is a circuit diagram of an electronic isolator implemented with a class A amplifier.

An embodiment of the present invention in which the isolator is implemented with a class A amplifier is illustrated in FIG. 12. Electronic isolator 1200 is coupled to source block at node N301. Isolator 1200 is coupled to load block at node N401. N-Type transistor Q1201 and resistors R1201, R1202, R1203 and R1204 comprise Class A amplifier 1205. Positive voltage bias V1201 couples amplifier 1205 to ground at node N1201. Negative voltage bias V1202 couples amplifier 1205 to ground at node N1204. Resistors R1201 and R1202 are coupled to the positive voltage bias V1201 at node N1201. Resistor R1201 is coupled to the base of transistor Q1201 at node N1202. Resistor R1202 is coupled to the collector of transistor Q1201 at node N1203. Resistors R1203 and R1204 are coupled to negative bias V1202 at node N1204. Resistor R1203 is coupled to the base of transistor Q1201 at node N1202. Resistor R1204 is coupled to the emitter of transistor Q1201 at Node N1205.

DC blocking capacitor C1201 is used to AC couple the reference signal into amplifier 1205. Accordingly, C1201 couples source block at node N301 to the emitter of Transistor Q1201 at Node N1205. DC blocking capacitor C1202 is used to AC couple the feedback signal into the amplifier. Accordingly, C1202 couples the base of transistor Q1201 at node N1202 to node N1206. Isolator input resistor R1205 couples source block at node N301 to capacitor C1202 at node N1206.

The amplifier output signal flows into Tee resistor R1206 from the collector of Q1201 to node N1206. Output resistor R1207 couples the output of amplifier 1205 to load block at node N401.

The amplifier bias levels (V1201 and V1202) depend on the throughput power level, load impedance (Z402), potential VSWR generated off the load, and injected noise levels.

The levels are chosen to insure that the amplifier has sufficient voltage swing to accommodate the above characteristics without railing against either bias supply. C1201 and C1202 are DC blocking capacitors used respectively to AC couple the reference and feedback signals into the amplifier. AC coupling in this manner avoids disruption of the amplifier bias point at high frequency. In another embodiment, the output signal into R1206 is AC coupled through a series DC blocking capacitor.

The selection of R1202 depends on several factors. The value should be large enough to achieve high gain in the amplifier. However, the value needs to be low enough so that the output impedance of the amplifier is low so that its characteristics continue to approximate a voltage source.

Emitter Follower Embodiment

Figure 13:
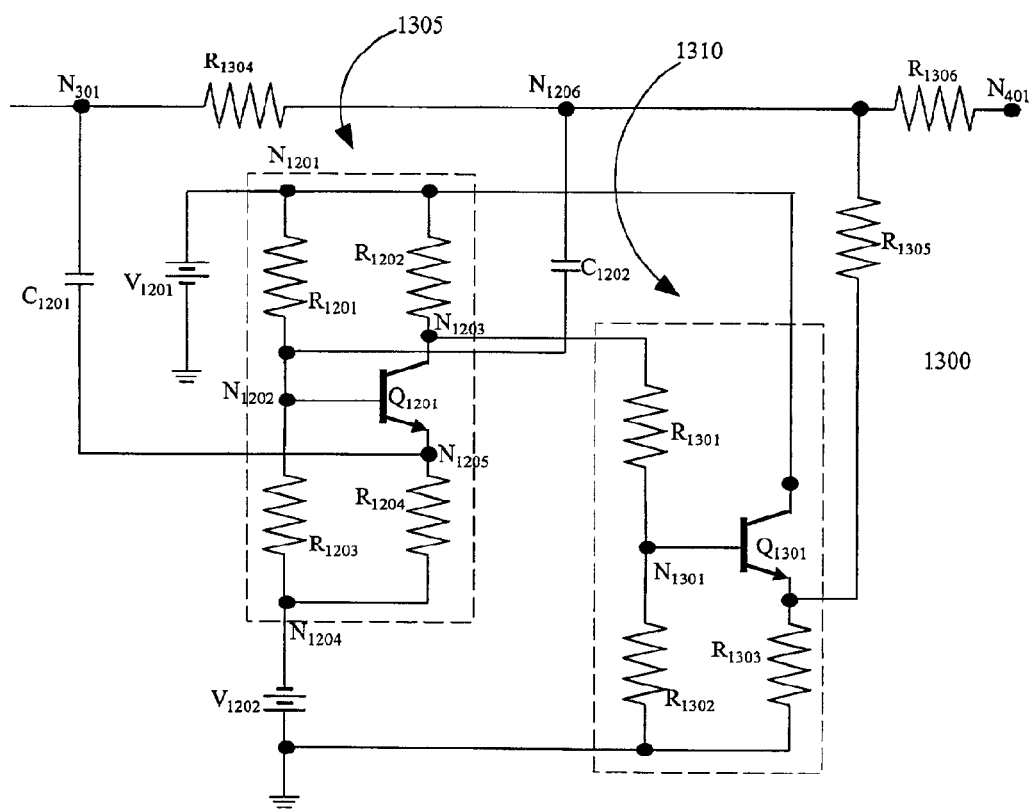
FIG. 13 is a circuit diagram of an electronic isolator implemented with a class A amplifier and emitter follower.

FIG. 13 is an embodiment in which the present invention is implemented with a Class A amplifier and emitter follower. Electronic isolator 1300 is coupled to source block at node N301. Isolator 1300 is coupled to load block at node N401. N-Type transistor Q1201 and resistors R1201, R1202, R1203 and R1204 comprise Class A amplifier 1305. Positive voltage bias V1201 couples amplifier 1205 to ground at node N1201. Negative voltage bias V1202 couples amplifier 1205 to ground at node N1204. Resistors R1201 and R1202 are coupled to the positive voltage bias V1201 at node N1201. Resistor R1201 is coupled to the base of transistor Q1201 at node N1202. Resistor R1202 is coupled to the collector of transistor Q1201 at node N1203. Resistors R1203 and R1204 are coupled to negative bias V1202 at node N1204. Resistor R1203 is coupled to the base of transistor Q1201 at node N1202. Resistor R1204 is coupled to the emitter of transistor Q1201 at Node N1205.

DC blocking capacitor C1201 is used to AC couple the reference signal into amplifier 1205. Accordingly, C1201 couples source block at node N301 to the emitter of Transistor Q1201 at Node N1205. DC blocking capacitor C1202 is used to AC couple the feedback signal into the amplifier. Accordingly, C1202 couples the base of transistor Q1201 at node N1202 to node N1206. Isolator input resistor R1304 couples source block at node N301 to capacitor C1202 at node N1206.

Emitter follower 1310 is comprised of resistors R1301, R1302, R1303 and transistor Q1301. Resistor R1301 couples the base of transistor Q1301 to the collector of transistor Q1201. Resistor R1302 couples the base of transistor Q1301 to ground. Resistor R1303 couples the emitter of transistor Q1301 to ground. The collector of transistor Q1301 is coupled to amplifier 1305 at node N1201.

Tee resistor R1305 couples the emitter of transistor Q1301 to input resistor R1304 and output resistor R1306 at node N1206. Output resistor R1306 couples the electronic isolator to load block at node N401.

An advantage of using an emitter follower embodiment is that R1202 can be made large providing a high gain from the amplifier. Similarly, coupling the output from the emitter of the emitter follower provides a low impedance source for driving Tee resistor R1305.

Power Amplifier Distortion Reduction Embodiment

Figure 14:
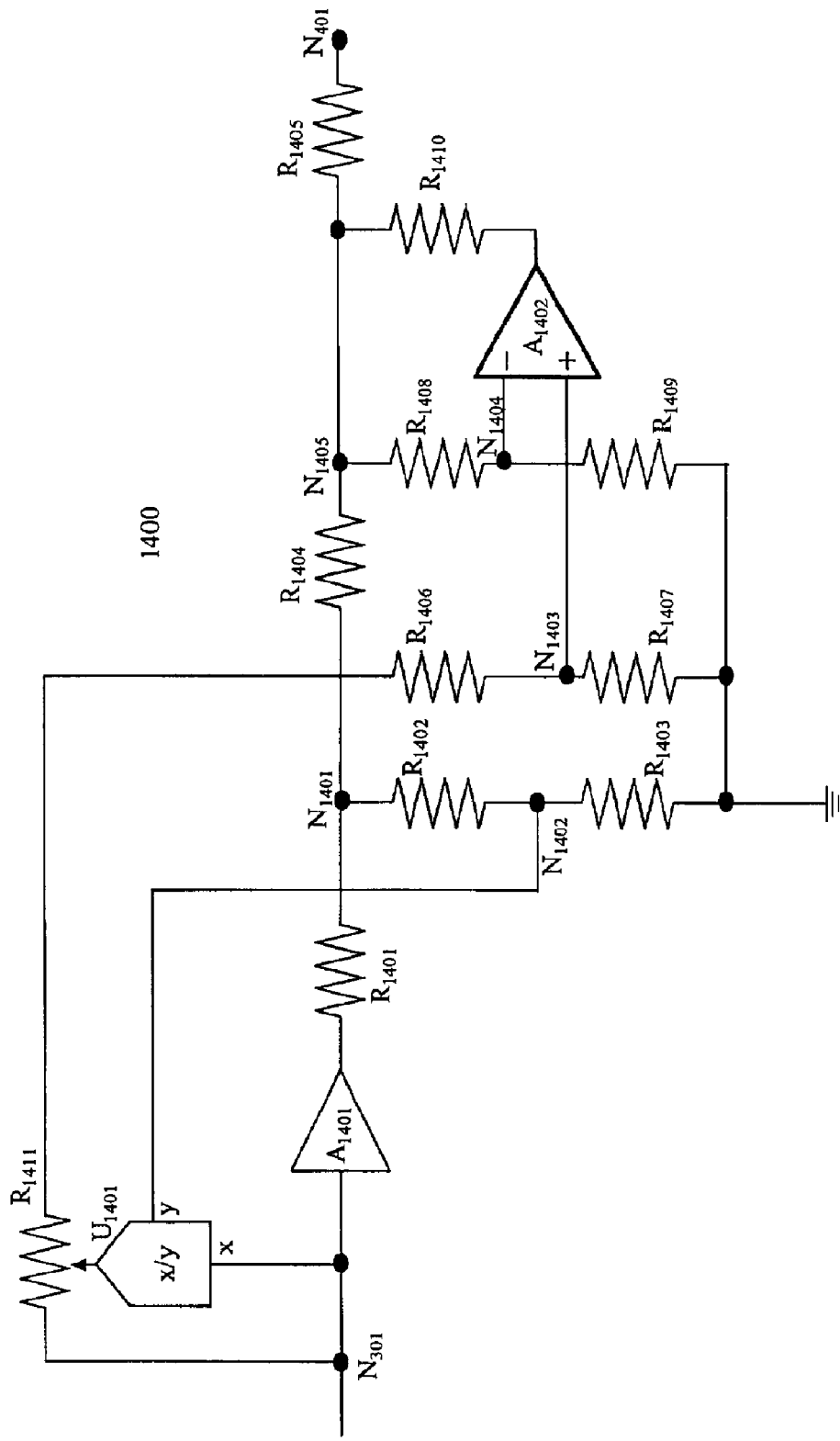
FIG. 14 is a circuit diagram of an implementation of the electronic isolator of the present invention to reduce power amplifier induced distortion.

FIG. 14 illustrates an embodiment of the present invention in which the topology of the isolator reduces signal distortion resulting from operation of the power amplifier. By moving the isolator sense input from the output of a power amplifier to the input (or other undistorted representation of the input) and adjusting the gain of the controlled source appropriately, the power amplifier induced distortion is included in the noise that is reduced by the isolator. Power amplifier A1401 should be designed to provide relatively low distortion.

This embodiment also has the effect of including the time delay of the signal through the power amplifier A1401 in the incident power path of the isolator. This provides a value against which to match the control circuitry delay.

As in the previous embodiments, V301 represents the signal source with its source resistance R301, and Z402 represents the input impedance of the next circuit. V401 represents the source of noise being injected into the system through its source impedance Z401. Electronic isolator 1400 is coupled to source block at node N301. Isolator 1400 is coupled to load block at node N401.

Power amplifier A1401 is coupled to source block at node N301. Resistor R1401 represents the output resistance of amplifier A1401. Resistors R1402 and R1403 constitute a resistive voltage divider that produces a sample of the output signal from power amplifier A1401. Resistor R1402 is coupled to resistor R1401 at node N1401 and to resistor R1403 at node N1402. Resistor R1403 couples R1402 to ground. Divider U1401 divides the sampled power amplifier output at node N1402 by the input voltage to power amplifier A1401 at node N301 to produce an output signal that is representative of the voltage gain of power amplifier A1401. The output of U1401 adjusts the resistance of variable resister R1411 based on the calculated power amplifier voltage gain. In one embodiment, the adjustment of resistor R1411 is accomplished using digital control circuitry. In another embodiment, resistor R1411 is adjusted using analog control circuitry. R1411 is coupled to source block at node N301.

Resistors R1411, R1406 and R1407 together comprise a resistor divider network used to set the isolator controlled source function gain. Resistor R1406 couples resistor R1411 to resistor R1407. Resistor R1407 couples R1406 to ground. The positive terminal of operational amplifier A1402 is coupled to resistors R1406 and R1407 at node N1403. Resistors R1408 and R1409 provide voltage gain for the amplifier stage. This is necessary because the reference input signal to amplifier A1402 is being taken from the input of amplifier A1401 rather than the output. Thus, the reference signal is smaller than the feedback signal. Accordingly, the negative terminal of amplifier A1402 is coupled to resistors R1408 and R1409 at node N1404. Resistor R1409 couples resistor R1408 to ground. Resistor R1408 couples the divider network to resistor R1404 at node N1405. Resistor R1404 couples the divider network to resistor R1401 at node N1401.

The output current of amplifier A1402 flows through resistor R1410 to node N1405. At node N1405, resistor R1405 couples the isolator circuit to load block at node N401.

RF Switch Embodiment

FIG. 15 illustrates an embodiment of a RF switch for use in one or more embodiments of the present invention. In RF switch 1500, diodes D1501 and D1502 are clamps limiting the reflected peak voltage seen by the isolator active circuitry. D1501 and D1502 are selected so as to provide an easily detectable degree of rectification at the maximum operating or reflected power frequency the circuit will encounter. Positive voltage clamp supply V1501 is coupled to the cathode of D1501 and is of sufficient magnitude so as to reverse bias D1501 under all normal operating conditions. Negative voltage clamp supply V1502 is coupled to the anode of D1502 and is of sufficient magnitude so as to reverse bias D1502 under all normal operating conditions. The negative terminal of V1501 and positive terminal of V1502 ground the circuit at node N1504.

Current sense resistor R1501 couples the anode of D1501 to current sense resistor R1502 at node N1501. Resistor R1502 couples the cathode of diode D1502 to resistor R1501 at node N1501. Input to RF switch 1500 is coupled to resistors R1501 and R1502 at node N1501. The voltages across resistors R1501 and R1502 are inputs to control circuit 1505 and control circuit 1510, respectively. Control circuits 1505 and 1510 switch the bias voltages on RF switch diodes D1503 and D1504.

DC blocking capacitor C1501 couples RF switch input at node N1501 to the anode of diode D1504 at node N1502. DC blocking capacitor C1503 couples the cathode of D1504 to the output terminal of RF switch 1500. DC blocking capacitor C1502 couples RF switch input at node N1501 to the anode of diode D1503 at node N1503. Inductors L1501, L1502, L1503, L1504, L1505, and L1506 are RF chokes whose function is to simultaneously block transmission of the RF signal through the inductor and provide a low resistance dc path for circuit bias and control signals. Inductor L1501 couples the cathode of D1503 to ground. Resistor R1504 is connected in parallel across inductor L1501.

Bias switches Q1501, Q1502, Q1503 and Q1504 can be any switching devices suitable and appropriate for the application and known to those of skill in the art. In one embodiment, bias switches Q1501, Q1502, Q1503 and Q1504 are bipolar semiconductor devices. In another embodiment, the bias switches are field effect transistors (FETs).

The bias current to RF switch 1500 is supplied by switch bias supply V1503. From node N1504, bias supply V1503 couples to switch Q1502 at node N1505. Switch Q1502 couples V1503 in series to resistor R1505. Inductor L1504 couples resistor R1505 to the anode of diode D1504 at node N1502. Resistor R1506 is intended to function as a matched dummy load if the output of the RF switch is shorted to ground. Resistor R1506 is coupled in parallel to diode D1504. Inductor L1506 couples the cathode of diode D1504 to ground. Inductor L1505 couples the anode of diode D1504 in series to switch Q1503. Switch Q1503 in turn couples inductor L1505 to the anode of diode D1502.

From node N1505, switch Q1501 couples V1503 and Q1502 to series coupled resistor R1503 and inductor L1502. Inductor L1502 and inductor L1503 are coupled to the anode of diode D1503 at node N1503. Switch Q1504 couples the anode of diode D1502 to inductor L1503.

Electronic Isolator Implemented with Crossover Networks

Figure 16:
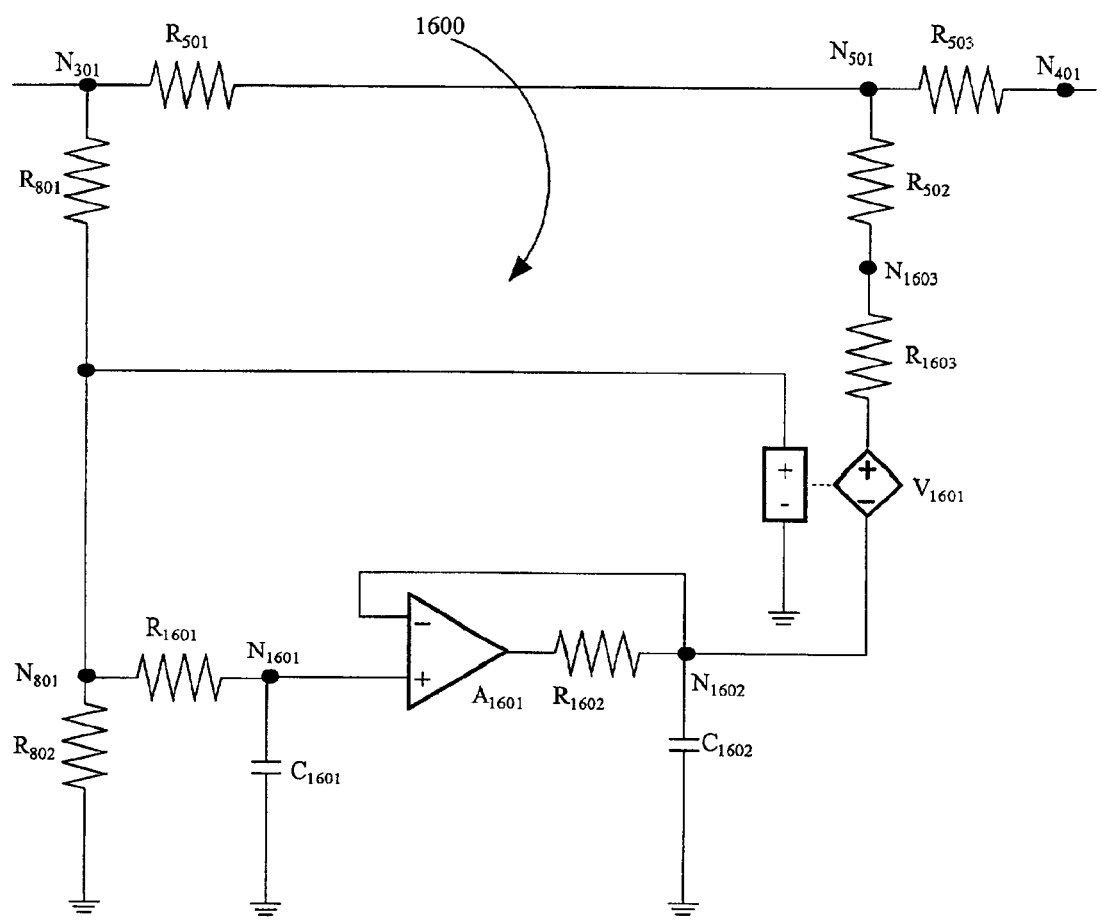
FIG. 16 is a circuit diagram of an implementation of the electronic isolator of the present invention using crossover networks for transmission frequencies and frequency bands above the frequency response band of tee leg operational amplifiers.

FIG. 16 illustrates an alternate embodiment of the Electronic Isolator using crossover networks. In the embodiments of the invention previously described, the only explicit frequency limitation has been the maximum operating frequency achievable using operational amplifiers. In practice, there are few circuits that require continuous transmission of all frequencies between DC and microwave frequencies. The typical application requires the transmission of one or more bands of frequencies. FIG. 16 shows an embodiment of the present invention for use in applications where the transmitted frequency band is significantly above the maximum operating frequency of an operational amplifier. In this topology, the output of the operational amplifier is connected in series to the controlled voltage source such that both circuits drive the tee leg resistor. The controlled source provides in-band isolation in the manner of the embodiment described in relation to FIG. 6, but has an operating frequency range that does not overlap that of the operational amplifier. Since there are no source signals within the operating frequency range of the operational amplifier, it attempts to provide complete isolation by removing any signal present in this range. It functions as an active, low frequency noise cancellation filter.

In the present embodiment, there is a band of frequencies between the operating bands of the two series amplifiers in which the electronic isolator will provide no active noise cancellation. In many applications, this will not pose a problem for the system. However, in some applications, noise signals in the dead band may pose a significant problem for the system. Solutions to this problem include the use of active or passive band reject filters, or the addition of another controlled source in series in the tee leg, covering the problem frequency band.

In the embodiment of the present invention shown in FIG. 16, electronic isolator 1600 is coupled to source block at node N301. Isolator 1600 is coupled to load block at node N401. The isolator is connected to the source block at node N301 by resistors R501 and R801. R801 is connected to resistor R802 at node N801. Together, they form a resistor divider from which node N801 provides the input to the operational amplifier A1601 and controlled source V1601. Resistor R1601 couples the operational amplifier reference signal from node N801 to the plus input of A1601 at node N1601. R1601 is also coupled to capacitor C1601 at node N1601. R1601 and C1601 form an R-C filter for the plus input of A1601. Capacitor C1601 provides an AC ground at the plus input of A1601 at the lowest output signal frequency from the source block. This filtering is necessary in general because the operational amplifier, although incapable of processing the high frequency output signal from the source block, may have its normal operation disturbed by the presence of these signals.

This embodiment is used where there are no source signals within the operating frequency limits of operational amplifier A1601. Under these conditions, there are alternate embodiments where the plus reference signal of A1601 is obtained from node N301 or ground. In these embodiments, resistor R1601 is connected to either node N301 or ground instead of node N801.

Resistor R1602 receives the output of A1601. Capacitor C1602 is coupled to R1602 at Node N1602. Similar to the AC ground produced by capacitor C1601 on the plus input of A1601, capacitor C1602 provides an AC ground for the tee leg of the structure. Together with resistor R1602, they isolate the output of the operational amplifier A1601 from the high frequency signals present. Resistor R1602 couples the output of operational amplifier A701 into the tee leg of the isolator at node N1602. The feedback signal to the negative input of operational amplifier A1601 is shown taken from node N1602 rather than directly from the operational amplifier output as in the embodiment described for FIG. 8B. This is to avoid the potential large reduction in isolation due to the high total series resistance of resistors R1602, R1603, and R502. In an alternate embodiment in which this condition is acceptable, the feedback signal to the negative input of operational amplifier A1601 is connected directly to its output. In other embodiments, the negative feedback is taken from nodes N501 or N1603. In these embodiments, an R-C filter is added to the negative input of operational amplifier A1601 to isolate it from the high frequency signals present in the same manner as R1601 and C1601 isolate the plus input of A1601.

V1601 is a controlled voltage source with source resistance R1603. It takes its input from node N1602 and is coupled in series to resistors R1603 and R502. The voltage controller is coupled to ground at its negative terminal and to node N801 at its positive terminal. Resistor R502 is coupled to R501 and R503 at node N501. R503 couples the isolator to load block at node N401.

Together with R1603 and R502, V1601 produces the asymmetric isolation effect for in-band signals as described in the discussion of the embodiment illustrated in FIG. 6. In an alternate embodiment, controlled source V1601 takes its input directly from node N301 if it has means of adjusting its gain relative to node N301 other than resistive divider R801 and R802.

In an alternate embodiment, the controlled source V1603 and operational amplifier A1601 drive separate, parallel tee legs with separate resistors replacing R502, since the two amplifiers do not overlap in their operating frequency bands. In other embodiments, multiple parallel tee legs can be added for additional source signal operating bands.

The various single-stage embodiments illustrated and described in FIGS. 6, 7, 8A and 8B had multi-stage embodiments illustrated in FIGS. 9, 10 and 11. Similarly, there are alternate embodiments for the embodiment shown in FIG. 16 and the additional embodiments described in the discussion of FIG. 16.

Electronic Isolator with Augmented Out-of-Band Isolation

Many electronic circuit applications have signals that are constrained to specific frequency limits. In one or more embodiments of the present invention, the use of reactive components in the circuit substantially enhances performance in applications in which source signals are single frequency or have very narrow bandwidth.

Figure 17:
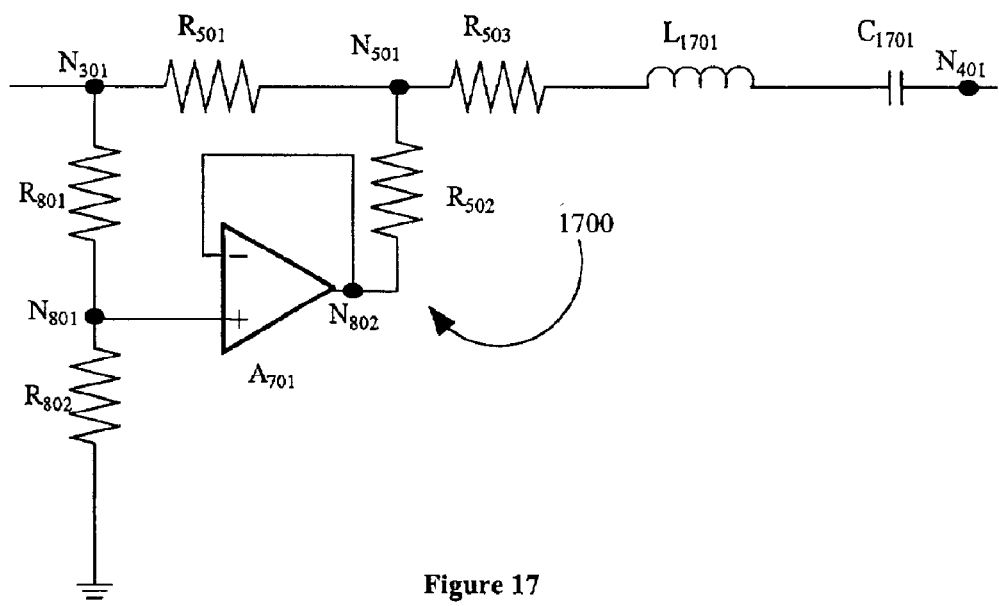
FIG. 17 is a circuit diagram of an implementation of the electronic isolator of the present invention for narrow band, forward signal transmission with augmented, out-of-band isolation.

FIG. 17 illustrates an embodiment of the present invention in which reactive components are incorporated into the circuit. The embodiment is similar to that illustrated in FIG. 8B with the following exception: resistor R503 of FIG. 8B has been replaced by inductor L1701, capacitor C1701 and resistor R503 connected in series. This three component series network is coupled to node N501 and to the load block at node N301. The values of L1701 and C1701 are chosen such that their series resonant frequency is the mid-band of the source signal. Thus configured, this network contributes a negligible amount to the insertion loss of the isolator. The increased out-of-band impedance of the output leg produced by the tuned circuit substantially increases the attenuation of out-of-band signals entering the isolator at its output connection to the load block.

In one embodiment, the L-C or R-L-C networks of FIG. 17 are replaced by multiple L-C and/or R-L-C networks connected in parallel, and stagger tuned to allow transmission of wider bandwidth input signals. In another embodiment, parallel L-C or R-L-C networks are incorporated into the present invention to block or provide substantially increased isolation at specific frequency bands. In practice, the number and location of reactive components incorporated into any Electronic Isolator embodiment can vary widely and are highly dependent on the application and the nature of the signals being transmitted through the isolator. Reactive networks can be placed in any or all of the legs of the isolator circuit, regardless of its configuration.

The embodiments of the invention described above collectively use a tee attenuator configuration and single conductor inputs and outputs. As is well known to those of skill in the art, equivalent embodiments can be easily structured around other attenuator forms. A two-stage version is the equivalent of using pi attenuator where some resistors function simultaneously as stage input and output resistors. A bridged tee structure can also be used as the base configuration. This is not a preferred topology since the bridge resistor will effectively shunt the isolator in the absence of a second, floating operational amplifier or controlled voltage source to control current through this path.

Similarly, many systems use multiple-conductor inputs and outputs such as twisted pair and twisted shielded pair lines, three-phase or a more general multi-conductor, multi-phase system. For twin conductor systems, the Electronic Isolator can be configured around a classic lattice attenuator topology. It can also be implemented using 2 tee topologies to provide independent isolation for each conductor. This is also the preferred embodiment for 3-phase and multi-phase systems. In principle a three-phase delta configuration can be implemented, but this embodiment will require multiple floating bias power supplies and sources that are not typically desirable.

Thus, an electronic circuit isolator has been described.

We claim:

1. An active electronic isolator between a source stage and a load stage, including at least one circuit path into which electrical noise is directed away from said source and said load stages, including configuring means for configuring said path to always appear as an infinite impedance to the output signal from said source stage, in which insertion loss of said electronic isolator is dependent upon the direction of signal and noise transmission through said electronic isolator, wherein said insertion loss in one direction is greater than in the other direction.

2. The electronic isolator of claim 1 wherein said configuring means comprises a voltage source.

3. The electronic isolator of claim 2 wherein said isolator comprises a T-configuration coupled to said voltage source.

4. The electronic isolator of claim 3 wherein said voltage source is a controllable voltage source.

5. The electronic isolator of claim 4 wherein said controllable voltage source adds or removes signal at the common node within said T-configuration such that substantially all of the source signal current is conducted to the load stage, and all other currents interring the node are directed into the circuit path within the T-configuration that is not connected to the source stage or load stage.

6. An active electronic isolator between a source stage and a load stage comprising:

an electrical input comprising at least one source electrical connection connected to the source stage, an electrical output comprising at least one load electrical connection to the load stage, at least one circuit path into which electrical noise is directed away from the source and load electrical connections, in which insertion loss of said electronic isolator is dependent upon the direction of signal and noise transmission through said electronic isolator, wherein said insertion loss in one direction is always greater than in the other direction.

7. The electronic isolator of claim 6 wherein insertion loss from the electrical input to the electrical output is substantially less than insertion loss from the electrical output to the electrical input.

8. The electronic isolator of claim 6 wherein at least one of said electrical input and said electrical output comprise at least one conductor using a ground signal return path.

9. The electronic isolator of claim 6 including a controllable source that is a current or voltage controlled voltage source circuit.

10. The electronic isolator of claim 9 wherein said controllable source is a pulsed voltage source.

* * * * *

UNITED STATES PATENT AND TRADEMARK OFFICE
CERTIFICATE OF CORRECTION

PATENT NO. : 6,897,704 B2
DATED : May 24, 2005
INVENTOR(S) : Robert D. Washburn and Robert F. McClanahan It is certified that error appears in the above-identified patent and that said Letters Patent is hereby corrected as shown below:

Title page,
Item [75], Inventors, replace the name "Robert F. McClanhan" with -- Robert F. McClanahan --.
Item [74], *Attorney, Agent, or Firm,* replace "Raysman Millstein Felder & Steiner LLP" with -- Brown Raysman Millstein Felder & Steiner LLP --.

Signed and Sealed this

Sixteenth Day of August, 2005

JON W. DUDAS
*Director of the United States Patent and Trademark Office*